United States Patent
Sasaki

Patent Number: 5,365,087
Date of Patent: Nov. 15, 1994

[54] PHOTODETECTOR AND OPTO-ELECTRONIC INTEGRATED CIRCUIT WITH GUARD RING

[75] Inventor: Goro Sasaki, Yokohama, Japan

[73] Assignee: Sumitomo Electric Industries, Ltd., Osaka, Japan

[21] Appl. No.: 89,378

[22] Filed: Jul. 12, 1993

[30] Foreign Application Priority Data

Jul. 15, 1992 [JP] Japan ................. 4-188158
Jul. 15, 1992 [JP] Japan ................. 4-188159

[51] Int. Cl.$^5$ ........................... H01L 27/14
[52] U.S. Cl. ......................... 257/184; 257/186; 257/459; 257/466; 257/623
[58] Field of Search ........... 257/466, 458, 459, 494, 257/438, 186, 187, 184, 185, 623, 495

[56] References Cited

U.S. PATENT DOCUMENTS

| | | | |
|---|---|---|---|
| 3,886,579 | 5/1975 | Ohuchi et al. | 257/438 |
| 4,616,247 | 10/1986 | Chang et al. | 257/458 X |
| 4,654,678 | 3/1987 | Lightstone et al. | 257/438 |
| 4,857,980 | 8/1989 | Hoeberechts | 257/458 X |
| 5,107,318 | 4/1992 | Makiuchi et al. | 257/459 X |

FOREIGN PATENT DOCUMENTS

| | | | |
|---|---|---|---|
| 0163295 | 12/1985 | European Pat. Off. | |
| 0451852 | 10/1991 | European Pat. Off. | |
| 3921028 | 1/1991 | Germany | |
| 63-224268 | 9/1988 | Japan | 257/459 |
| 0251284 | 2/1990 | Japan | 257/438 |

OTHER PUBLICATIONS

G. Sasaki et al., "Optoelectronic Integrated Receivers on InP Substrates by Organometallic Vapor Phase Epitaxy", *Journal of Lightwave Technology*, vol. 7, No. 10, Oct. 1989, pp. 1510–1514.

*Primary Examiner*—William Mintel
*Attorney, Agent, or Firm*—Beveridge, DeGrandi, Weilacher & Young

[57] ABSTRACT

A photodetector of the present invention is devised to reduce the dark current by employing a novel guard ring structure suitable for a mesa type photodiode (PD). Namely, the PD of the present invention has the structure in which a p-type or n-type semiconductor region which is to be a light receiving area is surrounded by a semiconductor region (guard ring) of the same conduction type. A guard ring electrode is formed on the guard ring region and is kept at the same potential as an electrode on a region desired to reduce the dark current. Also, an opto-electronic integrated circuit of the present invention has such a structure that a PD, which is the photodetector of the present invention, and a circuit element such as a transistor are formed on a common semiconductor substrate and that an anode electrode or a cathode electrode of the PD is conductively connected to a gate electrode of a field-effect transistor or to a base electrode of a bipolar transistor.

27 Claims, 13 Drawing Sheets

*Fig.27* *Fig.28* *Fig.29*
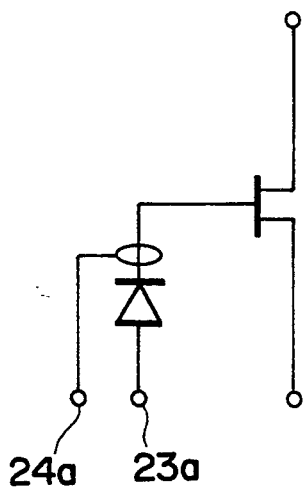 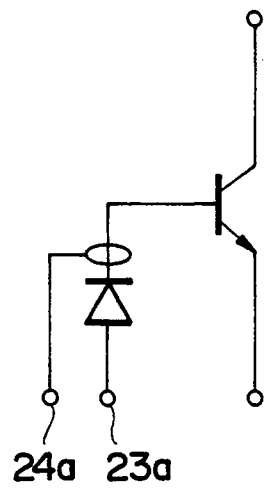 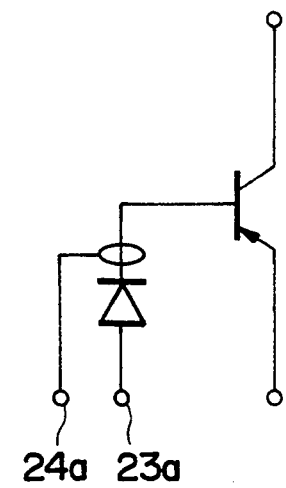
*Fig.30* *Fig.31* *Fig.32*
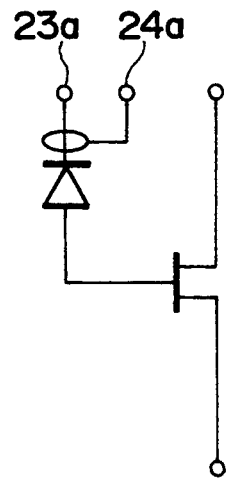 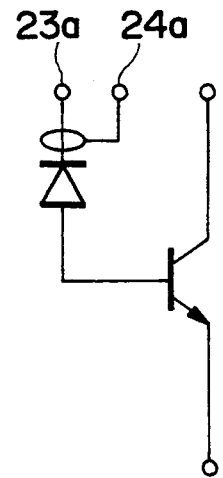 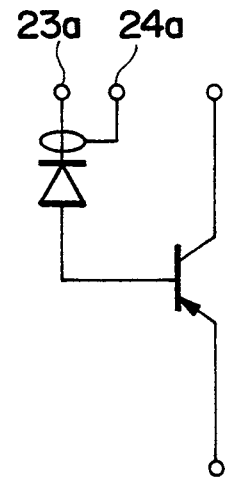

Fig.33  Fig.34  Fig.35
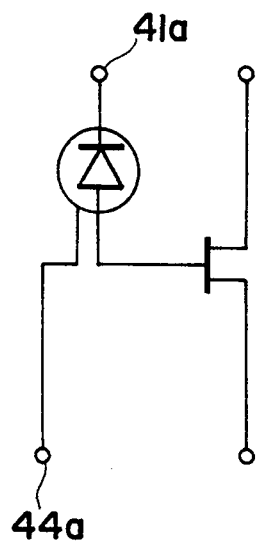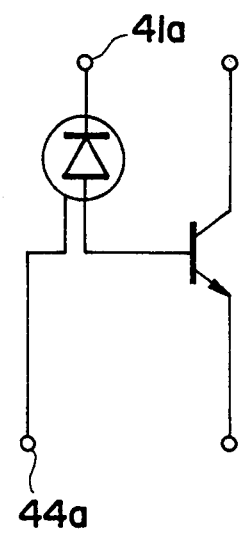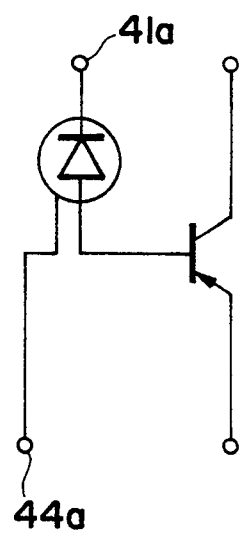
Fig.36  Fig.37  Fig.38
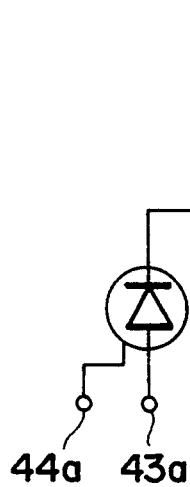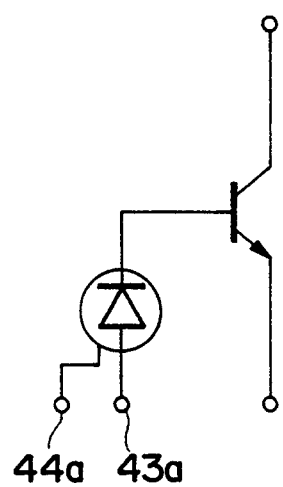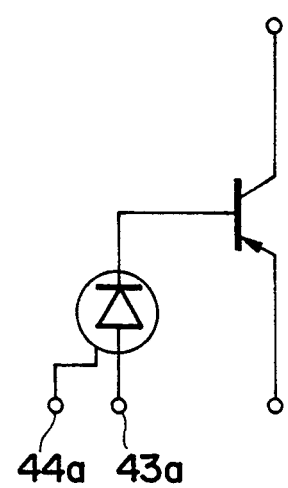

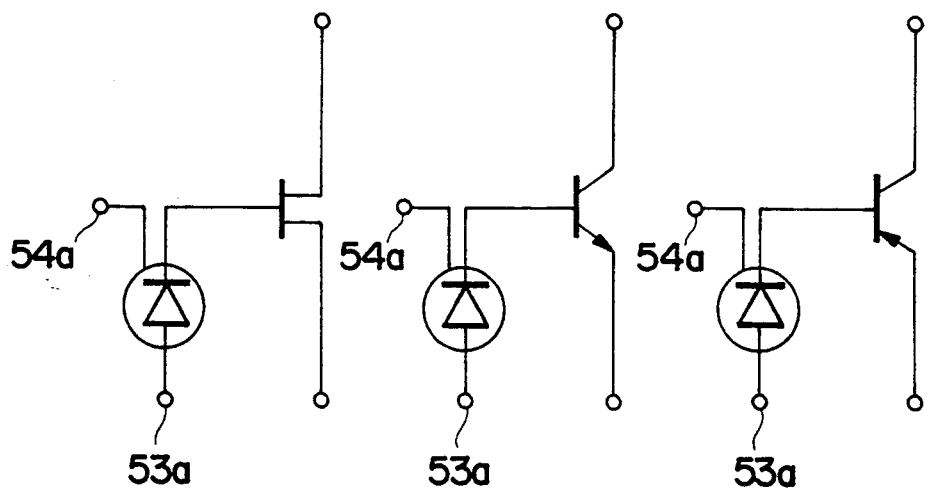
Fig. 39   Fig. 40   Fig. 41
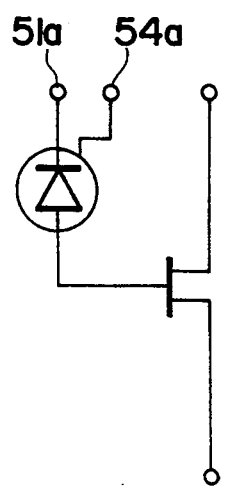
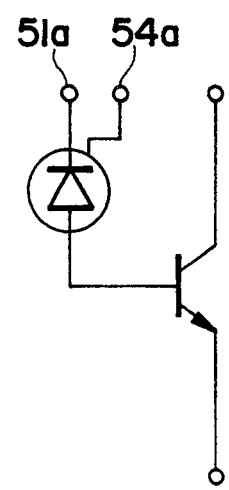
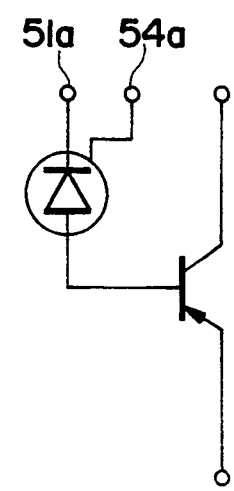
Fig. 42   Fig. 43   Fig. 44

PHOTODETECTOR AND OPTO-ELECTRONIC INTEGRATED CIRCUIT WITH GUARD RING

BACKGROUND OF THE INVENTION

1. Field of the Invention

The present invention relates to a photodetector and an opto-electronic integrated circuit used in optical communications systems. More particularly, the invention relates to a mesa type photodiode, and an opto-electronic integrated circuit in which a mesa type photodiode and a transistor are integrated on a common substrate.

2. Related Background Art

Photodiodes (as will be referred to simply as PD) take an important position as photodetector for optical fibers in optical communication systems. Specifically, PIN photodiodes (as will be referred to as PIN-PD) are frequently used for middle distance transmission or for small-to-middle capacity transmission, because their bias voltage is low and because high-speed PIN-PDs may be produced at a low cost. Further, avalanche photodiodes (as will be referred to as APD) having the basic structure of PIN-PD are suitable for high-speed and large-capacity transmission or for long-distance transmission and are widely used in such applications, because they have high sensitivity and high speed response characteristics. Ordinary APDs normally have the mesa type structure or the guard ring structure, because a high voltage is applied thereto. Also, there are recently proposed various opto-electronic integrated circuits in which a PD and an amplifying transistor are formed on a common semiconductor substrate.

For example, the following trial models were recently reported. An opto-electronic integrated circuit is formed by integrating a PIN-PD and three HEMTs (high electron mobility transistors) on a common semiconductor substrate (Goro Sasaki et al., IEEE Journal of Lightwave Technology, Vol. 7, No. 10, Oct. 1989, p1510–p1514). Another opto-electronic integrated circuit is formed by integrating a PIN-PD and a plurality of HBTs (heterojunction bipolar transistors) on a common semiconductor substrate (S. Chandrasekhar et al., IEEE Photonics Technology Letters. Vol. 2, No. 7, Jul. 1990, p505–p506).

The PD was formed as follows in such opto-electronic integrated circuits. Deposited on a semiconductor substrate in the named order are an n (p) semiconductor layer in which an n-type (or p-type) impurity is added, a high-resistive semiconductor layer with no impurity added, and a p (n) semiconductor layer in which a p-type (or n-type) impurity is added. An n-type ohmic electrode is formed on the n-type semiconductor layer, and a p-type ohmic electrode on the p-type semiconductor layer.

Further, the uppermost semiconductor layer, that is, the p (or n) semiconductor layer is removed except for the portion which is to become a light receiving area.

The PD with the above structure is easy to produce because of availability of general use techniques such as the diffusion method and the etching, but disadvantageous because of a large dark current flowing between the p-type semiconductor layer and the n-type semiconductor layer. If an opto-electronic integrated circuit is constructed by integrating the PD and various transistors on a common substrate, the dark current flows into gate electrodes of a transistor to cause the shot noise, which in turn raises a problem of lowering the receiving sensitivity. In addition, a leak current might flow between elements, which increases the dark current in the PD to cause the same problem.

The opto-electronic integrated circuits of this type have a light signal detecting function. This function is achieved by detecting an increase in electric current upon incidence of a light signal, which is flowing through either one of the anode electrode and the cathode electrode of the PD (as will be referred to as a light signal detecting electrode) which is one not conductively connected to a gate electrode of a transistor. If the current flowing through the light signal detecting electrode in the state of no incident light signal, that is, the dark current, is large, a current change upon incidence of light signal becomes relatively small enough to cause an error in light signal detecting function. In the arrangements using the conventional PDs, the dark current negatively affects the light signal detecting function, causing a problem of inferiority thereof.

SUMMARY OF THE INVENTION

The present invention has been accomplished taking the above problems into account. It is an object of the present invention to provide a mesa type PD having a structure capable of reducing the dark current. It is another object of the present invention to provide an opto-electronic integrated circuit having a structure capable of reducing the leak current.

A PD of the present invention has a novel guard ring structure suitable for mesa type PD, whereby the dark current is decreased. Specifically, the PD of the present invention comprises a first semiconductor region of either p-type or n-type, which is to be a light receiving area, and a second semiconductor region (guard ring) of the same conduction type. A guard ring electrode is formed on the second semiconductor region, and set at the same potential as an electrode needed to decrease the dark current.

For example, in case where the dark current is desired to decrease at the anode electrode (p-type electrode) of PD, the same potential as the anode electrode is given to the guard ring electrode. In such an arrangement a leak current flowing in a p-n junction exposed on the surface of the semiconductor flows into the guard ring so as to decrease the dark current at the anode electrode. On the other hand, in case that the dark current is desired to decrease at the cathode electrode (n-type electrode), the same potential as the cathode electrode is given to the guard ring. Then, no electric field is applied to the p-n junction exposed on the semiconductor surface, so that no dark current flows through the cathode electrode.

An opto-electronic integrated circuit of the present invention has the novel guard ring structure on the PD (photodetector) side, as described above, in which the anode electrode or the cathode electrode of the PD is conductively connected to a gate electrode of a field-effect transistor or to a base electrode of a bipolar junction transistor.

Since the novel guard ring region is kept at the same potential in operation as the selected semiconductor region, the guard ring region interrupts the dark current flowing over the semiconductor surface or the leak current flowing through a channel or the like on the surface of semiconductor substrate, thereby preventing the dark current or the leak current from reaching the light receiving area. When the guard ring protected anode electrode or cathode electrode of the photodetector is conductively connected to a gate electrode of a field-effect transistor or to a base electrode of a bipolar junction transistor, the influence of dark current or leak current may be suppressed to improve the reliability of light signal detection operation.

As described above, the photodetector of the present invention is so arranged that the guard ring region of the same conduction type as the first semiconductor region is disposed at a certain clearance around the first semiconductor region, which is to be a light receiving area, and that the guard ring region is kept at the same potential in operation as the light receiving area, or as the semiconductor layer of the photodetector contacting with the semiconductor substrate, whereby the guard ring region interrupts the current flowing through the substrate or on the semiconductor surface so as to prevent it from reaching the light receiving area. This arrangement can reduce the dark current remarkably. This effect is especially outstanding in the case where the substrate is InP and that at least the semiconductor layer without impurity is GaInAs.

Also, according to the opto-electronic integrated circuit of the present invention, the dark current in the photodetector and the leak current between the photodetector and the transistor are reduced, so that the lowering of receiving sensitivity may be advantageously avoided and the error of light signal detecting function may be minimized. This can greatly improve the reliability of operation of the circuit as compared with the circuits having the conventional structures.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIGS. 27–32 are drawings to show a constitutional example of an opto-electronic integrated circuit with the PD constructed as shown in FIGS. 4–6;

FIGS. 33–38 are drawings to show a constitutional example of an opto-electronic integrated circuit with the PD constructed as shown in FIGS. 9–11;

FIGS. 39–44 are drawings to show a constitutional example of an opto-electronic integrated circuit with the PD constructed as shown in FIGS. 12–14;

DESCRIPTION OF THE PREFERRED EMBODIMENTS

Embodiments of the present invention will be described in detail with reference to the accompanying drawings.

First embodiment of photodetector

Figure 1:
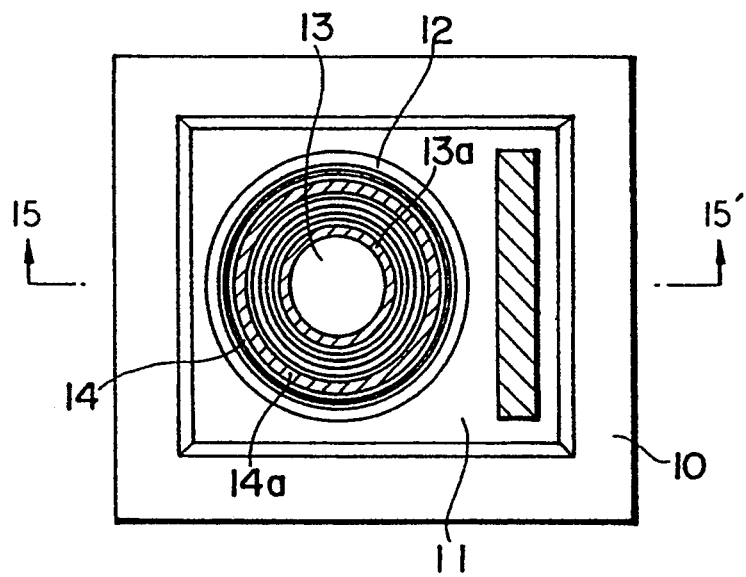
FIGS. 1–3 are constitutional drawings to show a PD in the first embodiment of the present invention.
Figure 2:
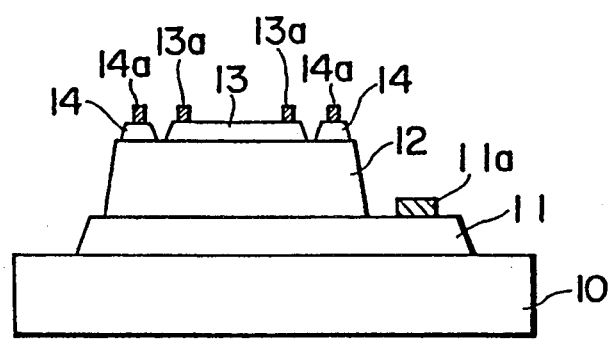
Figure 3:
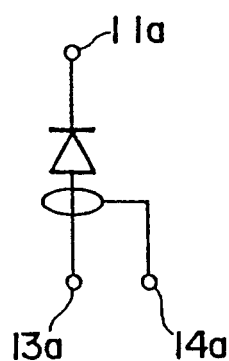

FIG. 1 to FIG. 3 show the structure of a PD of a first type according to the present invention. Formed on a surface of a semiconductor substrate 10 are an n-type semiconductor layer (cathode) 11, a high-resistive semiconductor layer (i layer) 12 with no impurity added, a light receiving area (anode) 13 of p-type semiconductor on the high-resistive semiconductor layer 12, and a guard ring region 14 of p-type semiconductor surrounding the light receiving area 13 at a certain clearance. Further, a cathode electrode (first electrode) 11a is formed on the surface of the n-type semiconductor layer 11, an anode electrode (second electrode) 13a on the surface of the light receiving area 13, and a guard ring electrode (third electrode) 14a on the guard ring region 14. The PD is so arranged, though not shown, that the guard ring electrode 14a has the same potential in operation as either the anode electrode 13a or the cathode electrode 11a.

FIG. 1 is an elevation of the PD in the first embodiment of the present invention, FIG. 2 a cross section of the PD along 15–15', and FIG. 3 an equivalent circuit diagram thereof. The PD is produced by the following steps.

The n-type semiconductor layer 11 for example of InP, GaInAsP, or GaInAs is first formed on the InP substrate 10 by the conventional OMVPE method. Then, the no-impurity-added high-resistive semiconductor layer 12, for example, of GaInAs and the p-type semiconductor layer, for example, of InP, GaInAsP, or GaInAs are consecutively formed. After that, the p-type semiconductor layer of the uppermost layer is separated by etching into a first p-type semiconductor region 13 which is to be a light receiving area and a second p-type semiconductor region 14 which is to be a guard ring region. The second p-type semiconductor region 14 is formed as shown such that it is separated at a certain clearance around the first p-type semiconductor region 13.

Further, unnecessary parts of the high-resistive semiconductor layer 12 and the n-type semiconductor layer 11 are removed to form the mesa type structure as shown. Then, the n-type ohmic electrode 11a is formed on the upper surface of the n-type semiconductor layer 11, and the p-type ohmic electrodes 13a, 14a on the respective upper surfaces of the first and the second p-type semiconductor regions 13, 14. Finally, the electrode 13a and the electrode 14a, or, the electrode 11a and the electrode 14a are connected to each other as to have the same potential in operation for example by connecting both electrodes 13a, 14a or 11a, 14a by a conductive member or by providing a conductive channel.

In case that the electrode 13a is arranged to have the same potential as the electrode 14a, a leak current flowing through the p-n junction exposed on the semiconductor surface flows into the second p-type semiconductor region 14, which is the guard ring region, so that the dark current may be remarkably reduced in the first p-type semiconductor region 13. On the other, in case that the electrode 11a is arranged to have the same potential as the electrode 14a, no electric field is applied to the p-n junction exposed on the semiconductor surface, so that no dark current flows through the p-n junction exposed on the semiconductor surface.

Second embodiment of photodetector

Figure 4:
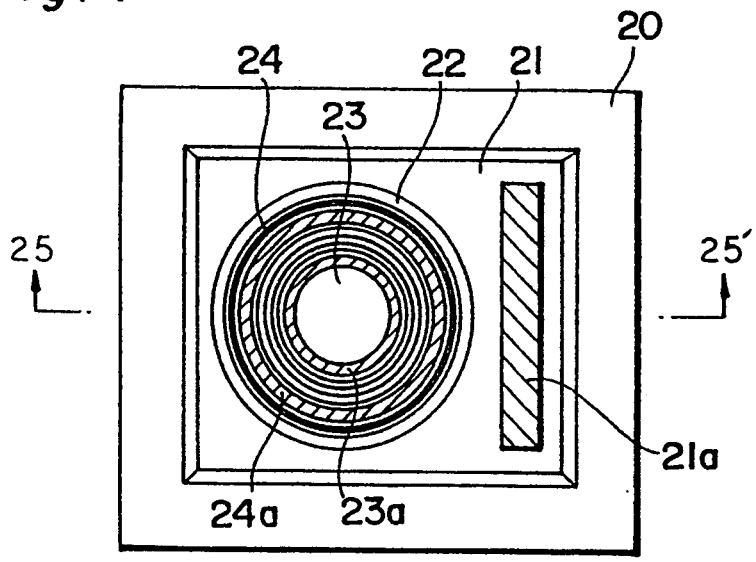
FIGS. 4–6 are constitutional drawings to show a PD in the second embodiment of the present invention.
Figure 5:
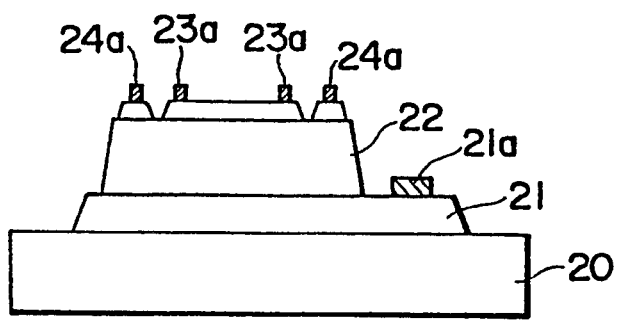
Figure 6:
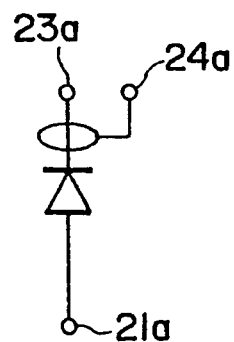

FIG. 4 to FIG. 6 show the structure of a PD of a second type according to the present invention. This PD has the same structure as the first type PD except that the n-type semiconductor and the p-type semiconductor are reversed as compared with those in FIGS. 1-3. Specifically, formed on a surface of a semiconductor substrate 20 are a p-type semiconductor layer (anode) 21, a high-resistive semiconductor layer (i layer) 22 with no impurity added, a light receiving area (cathode) 23 of n-type semiconductor on the high-resistive semiconductor layer 22, and a guard ring region 24 of n-type semiconductor surrounding the light receiving area 23 at a certain clearance. Further, an anode electrode (first electrode) 21a is formed on the surface of the p-type semiconductor layer 21, a cathode electrode (second electrode) 23a on the surface of the light receiving area 23, and a guard ring electrode (third electrode) 24a on the guard ring area FIG. 4 is an elevation of the PD in the second embodiment of the present invention, FIG. 5 a cross section of the PD along 25-25', and FIG. 6 an equivalent circuit diagram thereof. This PD is different in conduction type of the semiconductor layers or regions from the PD in the first embodiment.

More specifically, the p-type semiconductor layer 21 for example of InP, GaInAsP, or GaInAs is first formed on the InP substrate 20 by the same procedure. Then, the no-impurity-added high-resistive semiconductor layer 22, for example, of GaInAs and the n-type semiconductor layer, for example, of InP, GaInAsP, or GaInAs are consecutively formed thereon. After that, the n-type semiconductor layer of the uppermost layer is separated into a first n-type semiconductor region 23 which is to be a light receiving area and a second n-type semiconductor region 24 which is to be a guard ring region. The second n-type semiconductor region 24 is formed as shown such that it is separated at a certain clearance around the first n-type semiconductor region 23.

Further, unnecessary portions of the high-resistive semiconductor layer 22 and the p-type semiconductor layer 21 are removed to form the mesa type structure as shown. Then, the p-type ohmic electrode 21a is formed on the upper surface of the p-type semiconductor layer 21, and the n-type ohmic electrodes 23a, 24a on respective upper surfaces of the first and the second n-type semiconductor regions 23, 24. Finally, the electrode 23a and the electrode 24a, or, the electrode 21a and the electrode 24a are so arranged as to have the same potential in operation in the same manner as the PD in the first embodiment.

The mesa type PD with such structure may effectively suppress the dark current flowing through the p-n junction exposed on the semiconductor surface similarly as in the first embodiment.

Figure 7:
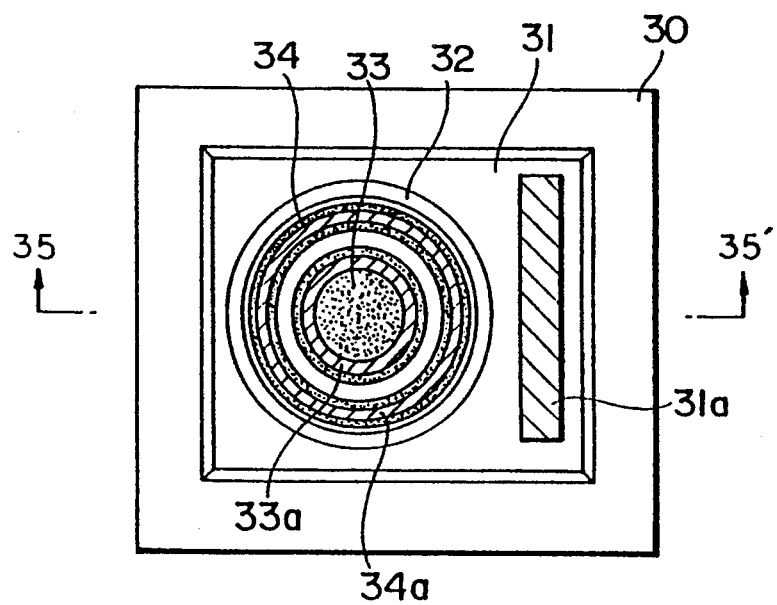
FIG.7 and FIG. 8 are constitutional drawings to show a PD produced by the ion implantation method, which is equivalent to the PDs in the first embodiment and in the second embodiment.
Figure 8:
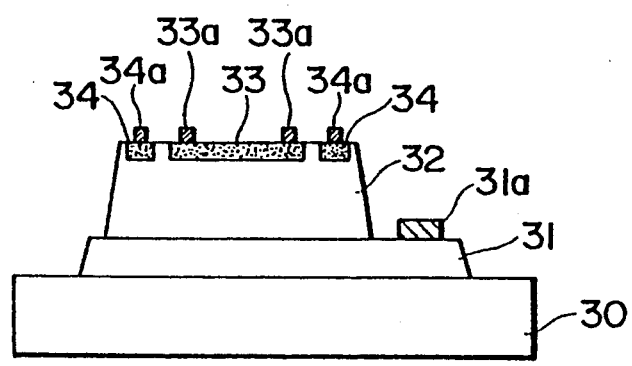

The above embodiments show examples of mesa type PDs, whereas PDs having the same structure as the above embodiments may be produced by ion implantation. FIG. 7 and FIG. 8 show the structure of such an example, in which reference numerals (30–34a) of elements correspond to those of the elements as shown in FIGS. 1–6, respectively.

In the PDs constructed as shown in FIG. 1 to FIG. 8, the guard ring region (14, 24, 34) is arranged to have substantially the same potential in operation as either the light receiving area (13, 23, 33) or the semiconductor region (11, 21, 31), so that the dark current flowing through the semiconductor surface may be interrupted by the guard ring region (14, 24, 34) so as not to readily reach the light receiving area (13, 23, 33). Therefore, the influence of dark current may be suppressed by conductively connecting the electrode (13a, 23a, 33a) of the light receiving region (13, 23, 33) or the electrode (11a, 21a, 31a) of the semiconductor layer (11, 21, 31) to a gate electrode of a field-effect transistor (not shown) or to a base electrode of a bipolar junction transistor (not shown).

Third embodiment of photodetector

Figure 9:
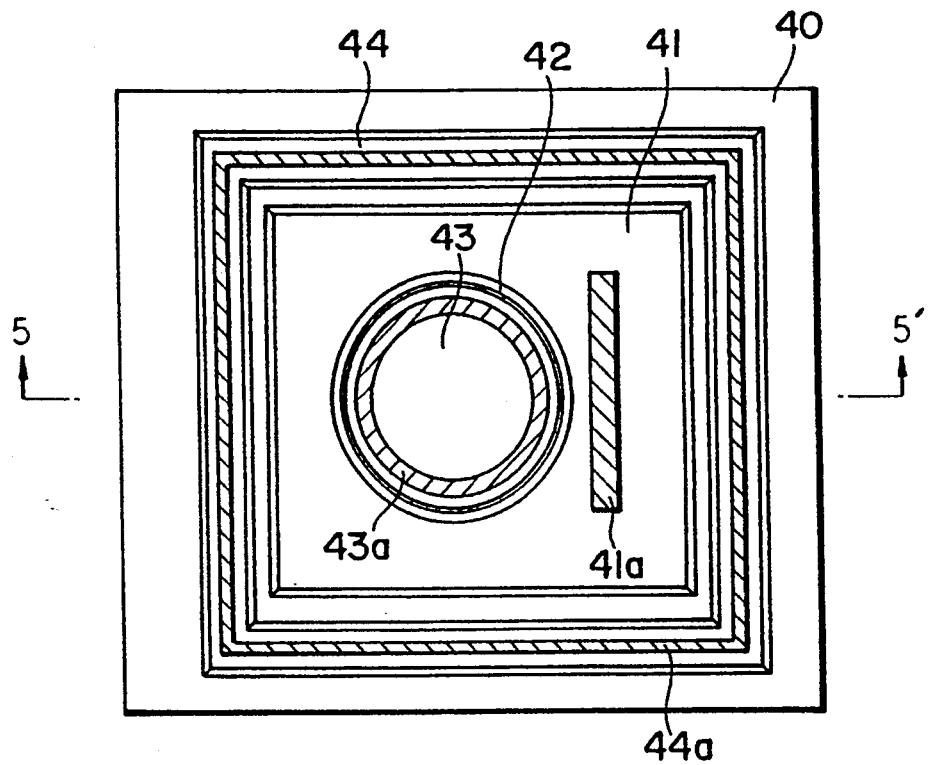
FIGS. 9–11 are constitutional drawings to show a PD in the third embodiment of the present invention.
Figure 10:
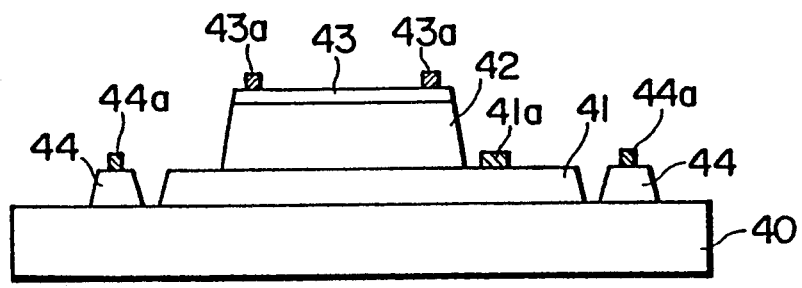
Figure 11:
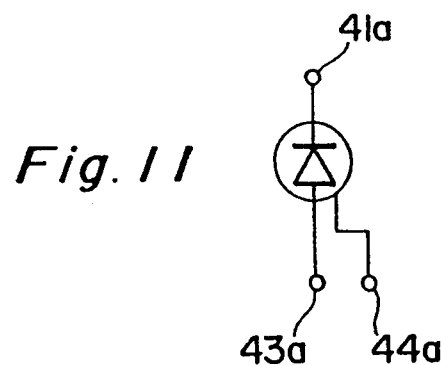

FIG. 9 to FIG. 11 show the structure of a PD of a third type according to the present invention. An n-type semiconductor layer (cathode) 41, a high-resistive semiconductor layer (i layer) 42 with no impurity added, and a light receiving area (anode) 43 of p-type semiconductor are formed in the named order on a semiconductor substrate 40. Also, a guard ring region 44 of n-type semiconductor is formed at a certain clearance around the n-type semiconductor layer 41. Further, a cathode electrode (first electrode) 41a is formed on the n-type semiconductor layer 41, an anode electrode (second electrode) 43a on the light receiving area 43, and a guard ring electrode (third electrode) 44a on the guard ring region 44. The PD is so arranged, though not shown, that the anode electrode 43a has the same potential in operation as the guard ring region 44a.

Fourth embodiment of photodetector

Figure 12:
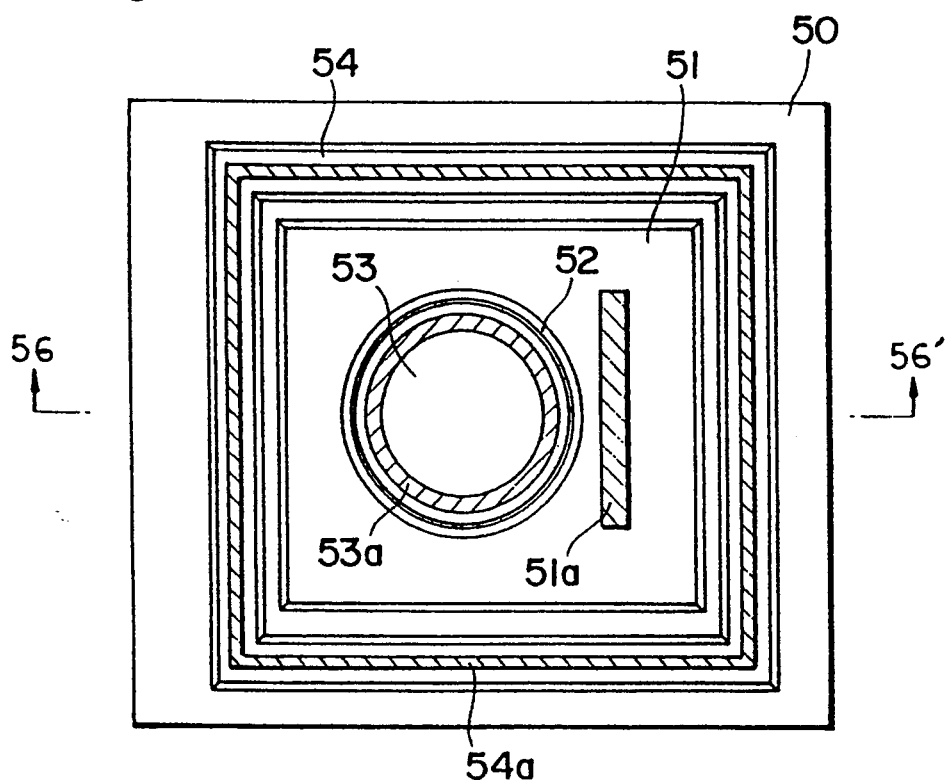
FIGS. 12–14 are constitutional drawings to show a PD in the fourth embodiment of the present invention.
Figure 13:
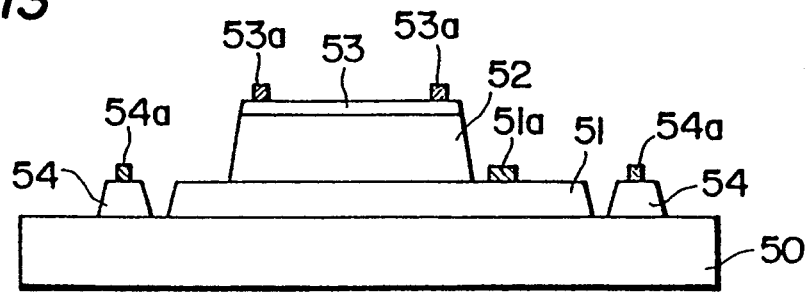
Figure 14:
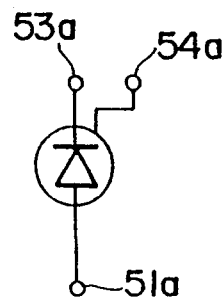

FIG. 12 to FIG. 14 show the structure of a PD of a fourth type according to the present invention. This PD has the same structure as the third type PD except that the n-type semiconductor and the p-type semiconductor are reversed from those in FIGS. 9–11. Specifically, a p-type semiconductor layer (anode) 51, a high-resistive semiconductor layer (i layer) 52 with no impurity added, and a light receiving area (cathode) 53 of n-type semiconductor are formed in the named order on a semiconductor substrate 50. Also, a guard ring region 54 of p-type semiconductor is formed at a certain clearance around the p-type semiconductor layer 51. Further, an anode electrode (first electrode) 51a is formed on the p-type semiconductor layer 51, a cathode electrode (second electrode) 53a on the light receiving area 53, and a guard ring electrode (third electrode) 54a on the guard ring region 54.

In the PDs constructed as shown in FIG. 9 to FIG. 14, the semiconductor layer (41, 51) and the guard ring region (44, 54) adjacent to the semiconductor substrate (40, 50) are kept substantially at the same potential, so that a leak current flowing through a channel or the like on the surface of semiconductor substrate may be interrupted by the guard ring region (44, 54) so as not to readily reach the light receiving area (43, 53). Therefore, the influence of dark current may be suppressed by conductively connecting the electrode (43a, 53a) of the light receiving area (43, 53) or the electrode (41a, 51a) of the semiconductor layer (41, 51) to a gate electrode of a field-effect transistor (not shown) or to a base electrode of a bipolar junction transistor (not shown).

Fifth and sixth embodiments of photodetector

Further, FIGS. 15–17 and FIGS. 18–20 show the respective structures of PDs of fifth and sixth types in combination of the guard ring structures of the PDs as shown in FIG. 7 to FIG. 14. First referring to FIG. 15 to FIG. 17, an n-type semiconductor layer (cathode) 61 and a high-resistive semiconductor layer (i layer) 62 with no impurity added are formed on a surface of a semiconductor substrate 60. Further, a light receiving area (anode) 63 of p-type semiconductor is formed on the high-resistive semiconductor layer 62, and a first guard ring region 64 of p-type semiconductor is formed at a certain clearance around the light receiving region 63. Also, a second guard ring region 65 of n-type semiconductor is formed at a certain clearance around the n-type semiconductor layer 61. A cathode electrode (first electrode) 61a is formed on the surface of the n-type semiconductor layer 61, an anode electrode (second electrode) 63a on the surface of the light receiving area 63, a first guard ring electrode (third electrode) 64a on the first guard ring region 64, and a second guard ring electrode (fourth electrode) 65a on the second guard ring region 65. The PD is so arranged, though not shown, that the first guard ring electrode 64a has the same potential in operation as either the anode electrode 63a or the cathode electrode 61a and that the second guard ring electrode 65a has the same potential in operation as the cathode electrode 61a.

Figure 15:
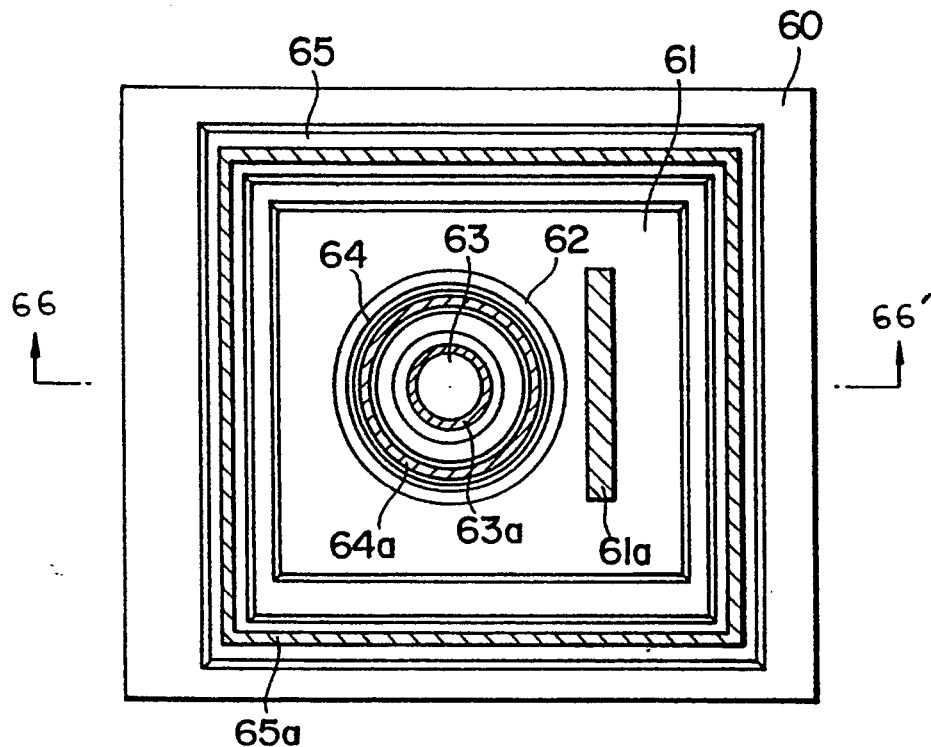
FIGS. 15–17 are constitutional drawings to show a PD in another embodiment of the present invention.
Figure 16:
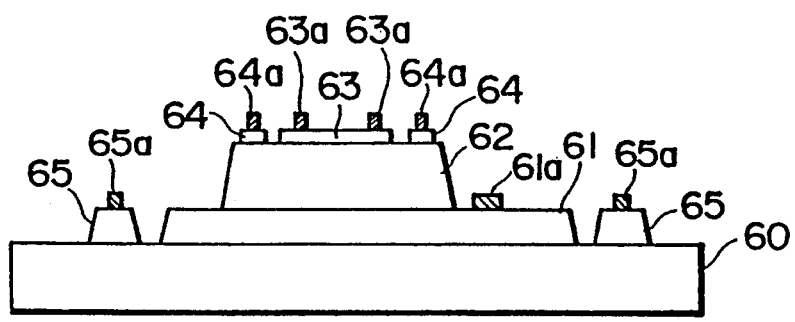
Figure 17:
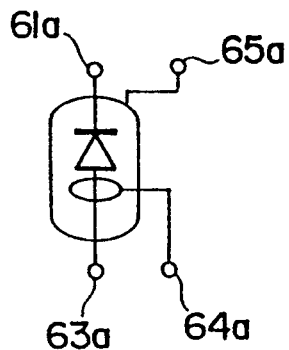
Figure 18:
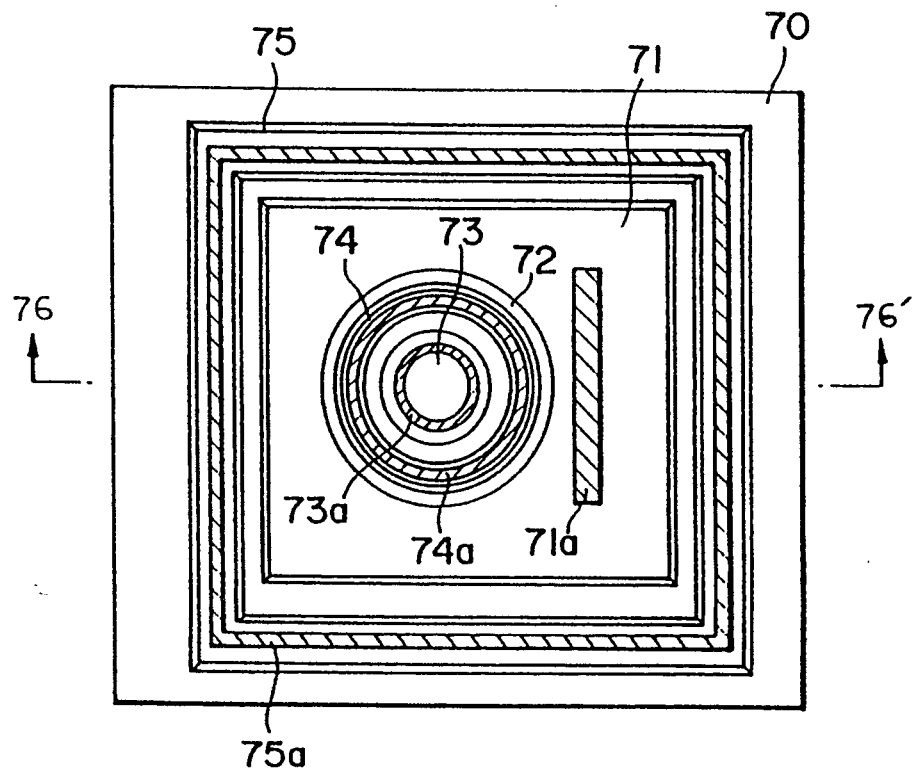
FIGS. 18–20 are constitutional drawings to show a PD in still another embodiment of the present invention.
Figure 19:
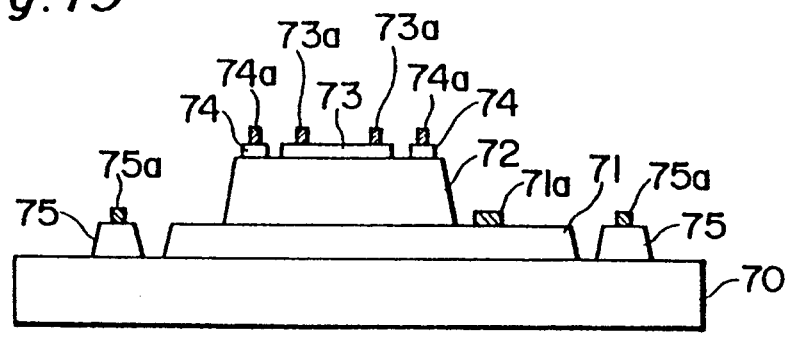
Figure 20:
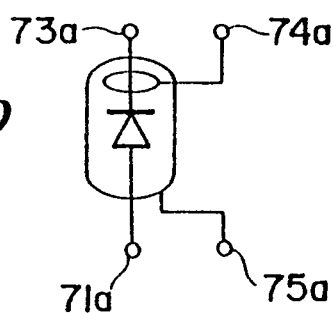
Figure 21:
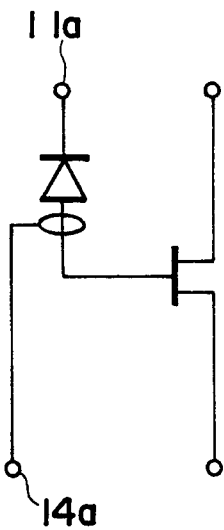
FIGS. 21–26 are drawings to show a constitutional example of an opto-electronic integrated circuit with the PD constructed as shown in FIGS. 1–3.
Figure 22:
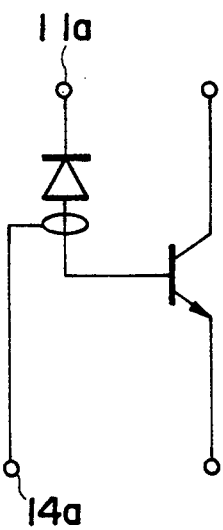
Figure 23:
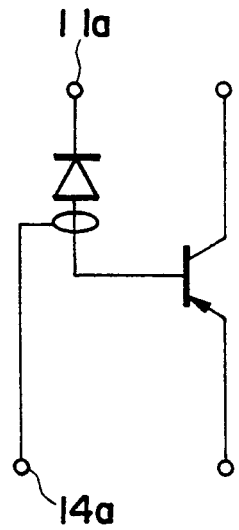
Figure 24:
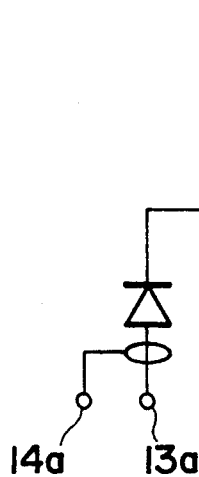
Figure 25:
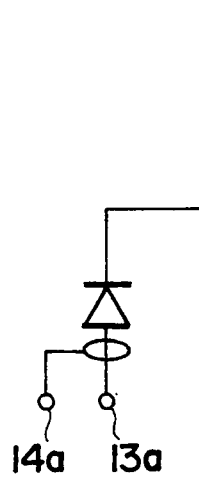
Figure 26:
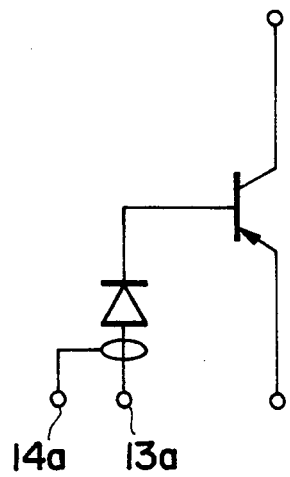

FIGS. 18–20 also have the same structure except that the n-type semiconductor and the p-type semiconductor are reversed from those in FIGS. 15–17. Specifically, a p-type semiconductor layer (anode) 17 and a high-resistive semiconductor layer (i layer) 72 with no impurity added are formed on a surface of a semiconductor substrate 70. Further, a light receiving area (cathode) 73 of n-type semiconductor is formed on the high resistive semiconductor layer 72, and a first guard ring region 74 of n-type semiconductor is formed at a certain clearance around the light receiving area 73. Also, a second guard ring region 75 of p-type semiconductor is formed at a certain clearance around the p-type semiconductor layer 71. An anode electrode (first electrode) 71a is formed on the surface of the n-type semiconductor layer 71, a cathode electrode (second electrode) 73a on the surface of the light receiving area 73, a first guard ring electrode (third electrode) 74a on the first guard ring region 74, and a second guard ring electrode (fourth electrode) 75a on the second guard ring region 75. The PD is so arranged that the first guard ring electrode 74a has the same potential in operation as either the cathode electrode 73a or the anode electrode 71a and that the second guard ring electrode 75a has the same potential in operation as the anode electrode 71a.

The PDs constructed as in FIG. 15 to FIG. 20 have the same characteristics as the PDs as shown in FIG. 1 to FIG. 14, so that the influence of dark current and leak current may be reduced thereby.

FIGS. 9–20 showed examples of mesa type PDs as described. PDs having the same structure may be also produced by ion implantation as one shown in FIGS. 7 and 8 to those in FIGS. 1–6.

Embodiment of opto-electronic integrated circuit

An embodiment of an opto-electronic integrated circuit according to the present invention will be described referring to the drawings. In the present embodiment, the PDs having the structures of FIG. 1 to FIG. 20 and transistors are formed on a common semiconductor substrate by the conventional production method. For example, employing the production process as described in the aforementioned references showing the trial models of opto-electronic integrated circuits and modifying the photo mask pattern, guard ring regions (14, 24, 34, 44, 54, 64, 74) and electrodes (14a, 24a, 34a, 44a, 54a, 64a, 74a) therefor are simultaneously formed at the formation step of the light receiving areas. The transistors may be HBTs involving FETs, or ordinary bipolar junction transistors. For convenience of description, respective elements are shown by circuit symbols, and connections by circuit constitutional diagrams.

FIG. 21 to FIG. 44 are circuit constitutional diagrams of opto-electronic integrated circuits in the embodiment of the present invention. FIG. 21 to FIG. 26 show examples of circuit structures involving the PD with the structure of FIGS. 1–3; FIG. 27 to FIG. 32 examples of circuit structures involving the PD with the structure of FIGS. 4–6; FIG. 33 to FIG. 38 examples of circuit structures involving the PD with the structure of FIGS. 9–11; and FIG. 39 to FIG. 44 examples of circuit structures involving the PD with the structure of FIGS. 12–14. Each PD is connected to a FET in FIGS. 21, 24, 27, 30, 33, 36, 39, or 42; to an n-p-n type bipolar transistor in FIGS. 22, 25, 28, 31, 34, 37, 40, or 43; to a p-n-p type bipolar transistor in FIGS. 23, 26, 29, 32, 35, 38, 41, or 44.

In these drawings, an electrode of each PD on the side where the guard ring region is located has the same polarity as the guard ring electrode. Further setting these electrodes at the same potential, the surface dark current flowing through the semiconductor substrate or the semiconductor surface, or the leak current flowing between the transistor and the PD flows into the guard ring region, so that the current does not affect the current flowing through a gate electrode of the transistor conductively connected to the electrode of the PD. The lowering of receiving sensitivity due to shot noise may be effectively prevented accordingly. FIGS. 21–23, FIGS. 27–29, FIGS. 33–35, and FIGS. 39–41 show the conditions.

If a large dark current should flow through a light signal detecting electrode (PD electrode not conductively connected to the transistor), a current change would be relatively small enough upon incidence of light signal to cause an error in light signal detecting function, as described before. This dark current is principally the surface dark current of the PD and the leak current between elements. Then, the light signal detecting electrode is set substantially at the same potential as the guard ring electrode, whereby the dark current and the leak current are reduced to minimize the error in light signal detecting function. FIGS. 24–26, FIGS. 30–32, FIGS. 36–38, and FIGS. 42–44 show the conditions.

Among the opto-electronic integrated circuits as described, there are shown specific structures corresponding to the circuits in FIG. 36 and in FIG. 42 as examples.

Opto-electronic integrated circuit corresponding to the circuit in FIG. 36

Figure 45:
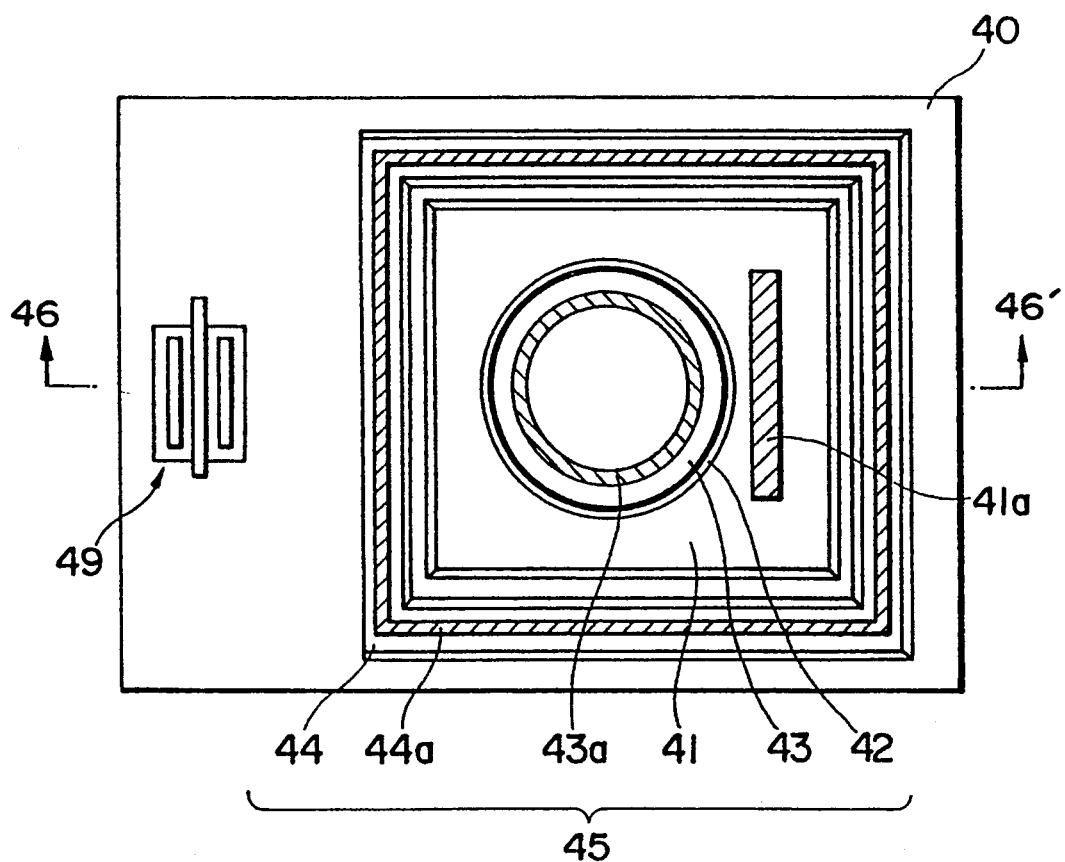
FIGS. 45 and 46 are constitutional drawings to show an opto-electronic integrated circuit according to the present invention.
Figure 46:
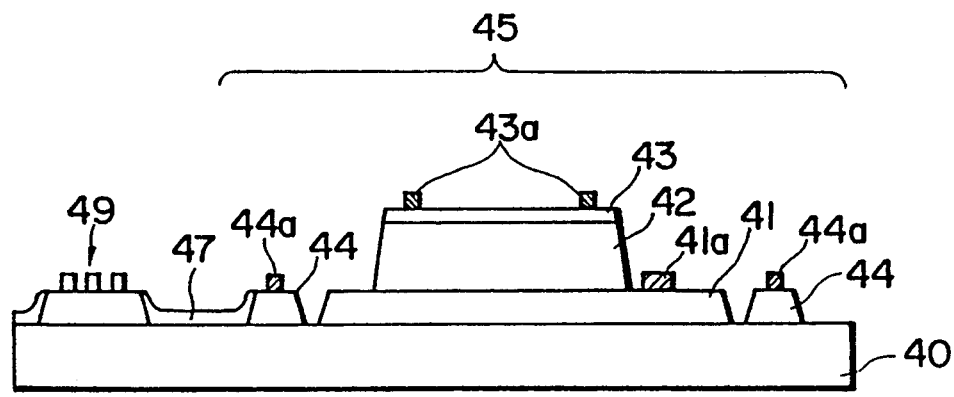

FIG. 45 is an elevation to show an embodiment of an opto-electronic integrated circuit corresponding to the circuit in FIG. 36, and FIG. 46 is a cross section thereof along 46–46'.

This opto-electronic integrated circuit is a semiconductor integrated circuit in which a PD 45 and a plurality of transistors 49 are formed on an InP substrate 30 as the PD 45 and the transistors 49 are formed as shown in FIGS. 45–46. FIGS. 45–46 show only one each of PD 45 and transistor 49 for brevity of illustration.

The PD 45 is so constructed that an n-type semiconductor layer 41 for example of InP, GaInAsP, or GaInAs, a high-resistive semiconductor layer 42 for example of GaInAs with no impurity added, and a p-type semiconductor layer (light receiving area) 43 for example of InP, GaInAsP, or GaInAs are formed in the named order at predetermined portions on a substrate 40. Further, an n-type ohmic electrode 41a is formed on the upper surface of the n-type semiconductor layer 41, and a p-type ohmic electrode 43a on the upper surface of the p-type semiconductor layer 43. A guard ring region 44 is formed of n-type semiconductor for example of InP, GaInAsP, or GaInAs, and a guard ring electrode 44a is formed on the upper surface thereof.

In the opto-electronic integrated circuit of this structure, a channel is formed by surface state in an interface between the semi-insulating InP substrate 44 and a passivation film 47 as shown. A current flowing through this channel is the leak current. If this leak current flows into the electrodes 41a, 43a of the PD 45, it becomes a dark current. The guard ring region 44 interrupts the leak current. Specifically, the guard ring electrode 44a is set at the same potential in operation as the electrode 41a on the n-type semiconductor layer 41. As so arranged, the guard ring region 44 and the n-type semiconductor layer 41 are kept at the same potential in operation, whereby the leak current may be prevented from flowing into the main structure of the PD 45.

This can reduce the dark current and solve problems of lowering of receiving sensitivity and inferiority of light signal detecting function.

Opto-electronic integrated circuit corresponding to the circuit in FIG. 42

Figure 47:
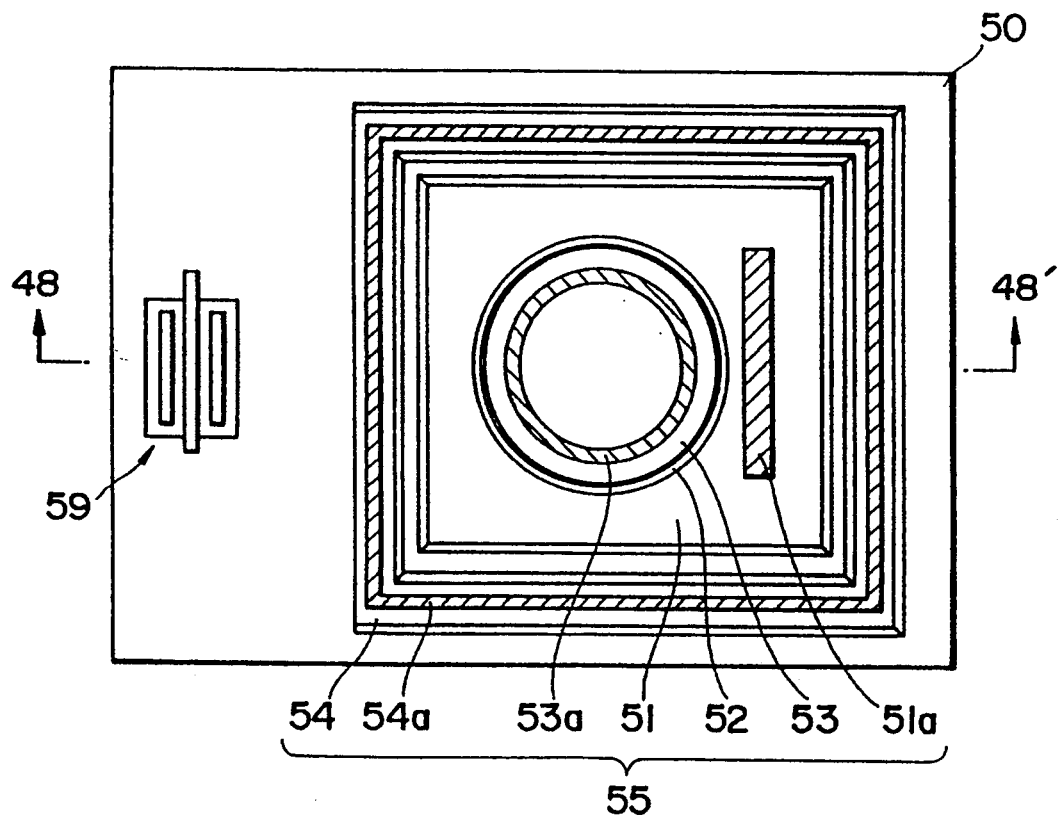
FIGS. 47 and 48 are constitutional drawings to show an opto-electronic integrated circuit according to the present invention.
Figure 48:
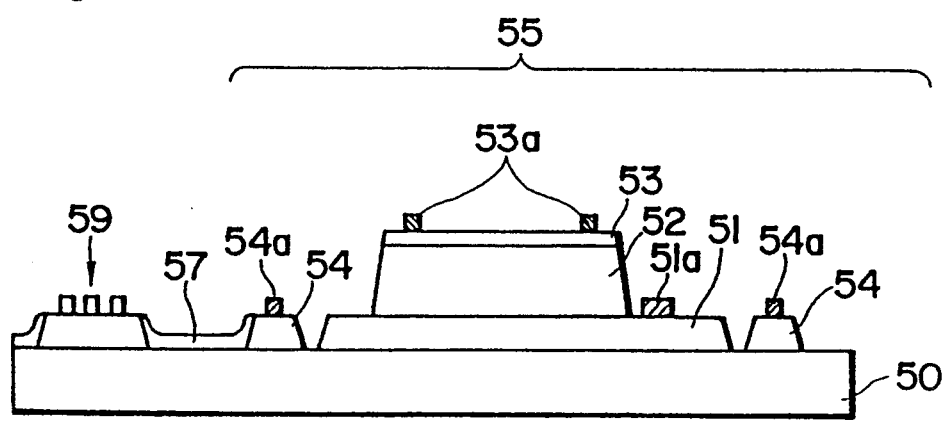

FIG. 47 is an elevation to show another embodiment of the opto-electronic integrated circuit corresponding to the circuit in FIG. 42, and FIG. 48 is a cross section thereof along 48–48'.

This opto-electronic integrated circuit is different from that corresponding to the circuit of FIG. 36 as described in that the conduction types of the semiconductor layers or regions are changed. Specifically, a PD 55 is so arranged that a p-type semiconductor layer 51 for example of InP, GaInAsP, or GaInAs, a high-resistive semiconductor layer 52 for example of GaInAs with no impurity added, and an n-type semiconductor layer (light receiving area) 53 for example of InP, GaInAsP, or GaInAs are formed in the named order at predetermined portions on an InP substrate 50. Further, a p-type ohmic electrode 51a is formed on the upper surface of the p-type semiconductor layer 51, and an n-type ohmic electrode 53a on the upper surface of the n-type semiconductor layer 53.

Also, a guard ring region 54 is formed between the PD 55 and a transistor 59, which is formed of p-type semiconductor for example of InP, GaInAsP, or GaInAs. A guard ring electrode 54a is formed on the upper surface of the guard ring region 54.

In the opto-electronic integrated circuit of the structure, a channel is formed by surface state in an interface between the semi-insulating InP substrate 40 and a passivation film 57 as shown. A leak current flows through the channel, but may be prevented from flowing into the main structure of the PD 55 by setting the guard ring electrode 54a and the electrode 51a on the p-type semiconductor layer 51 at the same potential in operation similarly as in the third embodiment.

In the cases corresponding to the structures in FIGS. 15–17 and in FIGS. 18–21 in the present embodiment, it is clear from the above description that both the dark current and the leak current may be reduced to achieve the effect more than that as described above.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A mesa type photodetector formed on a semiconductor substrate, comprising:
    a first semiconductor region formed over a surface of said semiconductor substrate and having a first conduction type as a result of activation of an added impurity therein;
    a second semiconductor region formed over a surface of said first semiconductor region and having a conduction type as a result of activation of an added impurity therein;
    a guard ring region formed over said first semiconductor region at a certain clearance from an outer periphery of said second semiconductor region, and having the second conduction type as a result of activation of an added impurity therein;
    a first electrode formed on the surface of said first semiconductor region;
    a second electrode formed on a surface of said second semiconductor region; and
    a third electrode formed on a surface of said guard ring region.

2. A photodetector according to claim 1, wherein a high-resistive region is interposed between said first semiconductor region and said second semiconductor region, said high-resistive region being a semiconductor region having a higher resistance than the first and second semiconductor regions, and wherein said guard ring region is formed on a surface of said high-resistive region on a side of said second semiconductor region.

3. A photodetector according to claim 1, wherein said semiconductor substrate is made of InP and said high-resistive region is made of GaInAs.

4. A photodetector according to claim 2, wherein said high-resistive region contains substantially no impurity.

5. A mesa type photodetector formed on a semiconductor substrate, comprising;

a first semiconductor region formed over a first region of a surface of said semiconductor substrate and having a first conduction type as a result of activation of an added impurity therein;

a guard ring region formed over a second region of the surface of said semiconductor substrate at a certain clearance to an outer periphery of said first region, and having the first conduction type as a result of activation of an added impurity therein;

a second semiconductor region formed over a surface of said first semiconductor region and having a second conduction type as a result of activation of an added impurity therein;

a first electrode formed on the surface of said first semiconductor region;

a second electrode formed on a surface of said second semiconductor region; and a third electrode formed on a surface of said guard ring region.

6. A photodetector according to claim 5, wherein a high-resistive region is interposed between said first semiconductor region and said second semiconductor region, said high-resistive region being a semiconductor having a higher resistance than the first and second semiconductor regions.

7. A photodetector according to claim 6, wherein said semiconductor substrate is made of InP and said high-resistive region is made of GaInAs.

8. A photodetector according to claim 6, wherein said high-resistive region contains substantially no impurity.

9. A photodetector according to claim 5, further including a second guard ring region formed over the surface of said first semiconductor region at a certain clearance to an outer periphery of said second semiconductor region and having the second conduction type as a result of activation of an added impurity therein.

10. A photodetector according to claim 9, wherein a high resistive region is interposed between said first semiconductor region and said second semiconductor region, said high-resistive region being a semiconductor region having a higher resistance than the first and second semiconductor regions, and wherein the first guard ring region is formed on a surface of said high-resistive region on a side of said second semiconductor region.

11. A photodetector according to claim 10, wherein said semiconductor substrate is made of InP and said high resistive region is made of GaInAs.

12. A photodetector according to claim 10, wherein said high-resistive region contains substantially no impurity.

13. An opto-electronic integrated circuit, comprising a photodetector and
an electronic device including a transistor,
said photodetector and said transistor being formed over a surface of a common semiconductor substrate and being wired to each other;
said photodetector being a mesa type photodetector formed on the semiconductor substrate and including:
a first semiconductor region formed over a surface of said semiconductor substrate and having a first conduction type as a result of activation of an added impurity therein;
a second semiconductor region formed over a surface of said first semiconductor region and having a second conduction type as a result of activation of an added impurity therein;
a guard ring region formed over an upper portion of said first semiconductor region at a certain clearance from an outer periphery of said second semiconductor region, and having the second conduction type as a result of activation of an added impurity therein;
a first electrode formed on the surface of said first semiconductor region;
a second electrode formed on a surface of said second semiconductor region; and
a third electrode formed on a surface of said guard ring region.

14. An opto-electronic integrated circuit according to claim 13, wherein said transistor is a field-effect transistor, a gate electrode of said field-effect transistor being conductively connected to said first electrode of said photodetector.

15. An opto-electronic integrated circuit according to claim 13, wherein said transistor is a field-effect transistor, a gate electrode of said field-effect transistor being conductively connected to said second electrode of said photodetector.

16. An opto-electronic integrated circuit according to claim 13, wherein said transistor is a bipolar transistor, a base electrode of said bipolar transistor being conductively connected to said first electrode of said photodetector.

17. An opto-electronic integrated circuit according to claim 13, wherein said transistor is a bipolar transistor, a base electrode of said bipolar transistor being conductively connected to said second electrode of said photodetector.

18. An opto-electronic integrated circuit, comprising
a photodetector and
an electronic device including a transistor,
said photodetector and said transistor being formed over a surface of a common semiconductor substrate and being wired to each other,
said photodetector being a mesa type photodetector formed on the semiconductor substrate and including:
a first semiconductor region formed over a first region of a surface of said semiconductor substrate and having a first conduction type as a result of activation of an added impurity therein;
a guard ring region formed over a second region of the surface of said semiconductor substrate at a certain clearance to an outer periphery of said first region, and having the first conduction type as a result of activation of an added impurity therein;
a second semiconductor region formed over a surface of said first semiconductor region and having a second conduction type as a result of activation of an added impurity therein;
a first electrode formed on the surface of said first semiconductor region;
a second electrode formed on a surface of said second semiconductor region, and
a third electrode formed on a surface of said guard ring region.

19. An opto-electronic integrated circuit according to claim 18, wherein said transistor is a field-effect transistor, a gate electrode of said field-effect transistor being conductively connected to said first electrode of said photodetector.

20. An opto-electronic integrated circuit according to claim 18, wherein said transistor is a field-effect transistor, a gate electrode of said field-effect transistor being conductively connected to said second electrode of said photodetector.

21. An opto-electronic integrated circuit according to claim 18, wherein said transistor is a bipolar transistor, a base electrode of said bipolar transistor being conductively connected to said first electrode of said photodetector.

22. An opto-electronic integrated circuit according to claim 18, wherein said transistor is a bipolar transistor, a base electrode of said bipolar transistor being conductively connected to said second electrode of said photodetector.

23. An opto-electronic integrated circuit, comprising a photodetector and
an electronic device including a transistor,
said photodetector and said transistor being formed over a surface of a common semiconductor substrate while wired with each other,
said photodetector being a mesa type photodetector formed on the semiconductor substrate and including:
a first semiconductor region formed over a first region of a surface of said semiconductor substrate and having a first conduction type as a result of activation of an added impurity therein;
a second semiconductor region formed over a surface of said first semiconductor region and having a second conduction type as a result of activation of an added impurity therein;
a guard ring region formed in an upper portion of said second semiconductor region so as to surround said second semiconductor region at a certain clearance and having the second conduction type as a result of activation of an added impurity therein;
a first electrode formed on the surface of said first semiconductor region;
a second electrode formed on a surface of said second semiconductor region; and
a third electrode formed on a surface of said guard ring region;
wherein said photodetector further comprises a second guard ring region formed on the surface of said semiconductor substrate at a certain clearance to an outer periphery of said first semiconductor region and having the first conduction type as a result of activation of an added impurity therein.

24. An opto-electronic integrated circuit according to claim 23, wherein said transistor is a field-effect transistor, a gate electrode of said field-effect transistor being conductively connected to said first electrode of said photodetector.

25. An opto-electronic integrated circuit according to claim 23, wherein said transistor is a field-effect transistor, a gate electrode of said field-effect transistor being conductively connected to said second electrode of said photodetector.

26. An opto-electronic integrated circuit according to claim 23, wherein said transistor is a bipolar transistor, a base electrode of said bipolar transistor being conductively connected to said first electrode of said photodetector.

27. An opto-electronic integrated circuit according to claim 23, wherein said transistor is a bipolar transistor, a base electrode of said bipolar transistor being conductively connected to said second electrode of said photodetector.

* * * * *